United States Patent [19]

van den Brink

[11] Patent Number: 5,701,661
[45] Date of Patent: Dec. 30, 1997

[54] OPTICAL SYSTEM FOR MUTUALLY POSITIONING A PAD CARRYING MEMBER AND A MULTILEADED COMPONENT

[76] Inventor: Hans Gerard van den Brink, Clearvauklaan 10, 5625 LC, Eindhoven, Netherlands

[21] Appl. No.: 537,733
[22] PCT Filed: Apr. 14, 1994
[86] PCT No.: PCT/NL94/00077
 § 371 Date: Oct. 12, 1995
 § 102(e) Date: Oct. 12, 1995
[87] PCT Pub. No.: WO94/24839
 PCT Pub. Date: Oct. 27, 1994

[30] Foreign Application Priority Data

Apr. 14, 1993 [NL] Netherlands ............... 9300631

[51] Int. Cl.⁶ ............... B23P 19/04; H05K 13/04; H05K 13/08
[52] U.S. Cl. ............... 29/721; 29/741; 29/833
[58] Field of Search ............... 29/720, 740, 741, 29/832, 833, 721, 743; 250/458.1, 548; 355/62, 77; 356/393, 400; 901/47; 359/369, 396, 407

[56] References Cited

U.S. PATENT DOCUMENTS

| | | | |
|---|---|---|---|
| 4,269,505 | 5/1981 | Mayer | 250/548 X |
| 4,362,385 | 12/1982 | Lobach | 250/548 X |
| 4,473,842 | 9/1984 | Suzuki et al. | 29/832 X |
| 4,608,494 | 8/1986 | Kobayashi et al. | 29/721 X |
| 4,672,209 | 6/1987 | Karasaki et al. | 250/458.1 |
| 4,911,543 | 3/1990 | Hodgson | 356/393 X |
| 5,044,072 | 9/1991 | Blair et al. | 29/833 X |
| 5,212,880 | 5/1993 | Nishiguchi et al. | 29/721 X |
| 5,459,794 | 10/1995 | Ninomiya et al. | 356/400 X |

OTHER PUBLICATIONS

IBM Technical Disclosure Bulletin, vol. 34, No. 10 B. Mar. 1992, pp. 4–6.

*Primary Examiner*—Peter Vo
*Attorney, Agent, or Firm*—David P. Gordon

[57] ABSTRACT

The invention relates to a simple and economic optical system for mutually positioning SMD components having connecting leads and the corresponding pads on pad carrying members with the object of bringing the connecting leads and pads together in one plane through translation or rotation, of positioning them and fixing them. The optical system utilizes a beam splitter, so that it is possible to observe simultaneously with the human eye the spaces in front of and behind the beam splitter. For considerations of robustness the semi-transparent mirror used to this end is evaporated on a transparent substrate which has a finite thickness. A substrate having finite thickness leads to an apparent displacement of the space behind the substrate relative to the space in front of the substrate. The invention relates to the compensation of this displacement by the installation of a compensation plate having identical optical properties in the space over the semi-transparent mirror on the substrate. The semi-transparent mirror is inserted between two optically identical flat substrates.

20 Claims, 2 Drawing Sheets

OPTICAL SYSTEM FOR MUTUALLY POSITIONING A PAD CARRYING MEMBER AND A MULTILEADED COMPONENT

BACKGROUND OF THE INVENTION

With the enhancement of component density on the printed circuit board and the increasing number of connections per component, the rejects and cost of rejects will increase if process control remains unaltered. In parallel therewith there is a tendency to place the passive and active components in separate process steps, first the passive components in a reflow oven/solder bath and, subsequently, the active components with a system as described. With state-of-the-art technology, removing a component does not cause any problem, but the problem arises when the component is to be positioned or placed back respectively, in a controlled manner; the leads of the component are to coincide with minimum clearance with the corresponding pads on the printed circuit board.

Positioning systems to be used if the problems outlined above occur are known, it is true, but always have the drawback of having an extremely complex structure and being rather costly.

An example of such a system is known from the IBM Technical Disclosure Bulletin, Vol. 34, No. 10B, Mar. 1992, New York U.S., pages 4–6; "Precision superposition component placement tool for end-point sensing".

SUMMARY OF THE INVENTION

An essential feature of the invention is the simultaneity of observation, free from parallax, with a large field of view and a sufficiently high resolution (the human eye in combination with a magnifier and/or a binocular microscope, or in combination with one or more high resolution cameras, or in combination with a camera) of both the object (the foot print of the leads of the multileaded component) and the pattern of pads to which the leads are to be fixed.

For considerations of robustness the semi-transparent mirror used to this end in the invention is evaporated on a flat transparent substrate which has a finite thickness. The space behind the semitransparent mirror is called the image space; the space in front of the mirror, the observation side and component side, is called the object space. The mirror substrate having a finite thickness leads to a displacement of the image space relative to the object space. The inventive idea is the compensation of this displacement by the introduction in the object space of a compensation plate having identical optical properties.

The invention provides two systems for mutually positioning.

According to a first embodiment the centre of the field of view is selected to be observed at an angle of $\pi/2$. Depending on ergonomics and desired field of view, object plane and image plane will form a 20-to-30-degree angle relative to the beam splitter. The semitransparent mirror is sandwiched between substrate and compensation plate. Deviations of the printed circuit board or footprint from their corresponding surfaces have a marginal effect on the misalignment after unison. In the case of high-pitch components, an alternative method of referencing will have to be implemented.

According to a second embodiment a supporting plate is chosen which is equidistant to the contact side of the printed circuit board holder, on the one hand, and, on the other hand, to the upper surface of the compensation plate which upper surface likewise functions as the contact area for the foot print of the component leads, all this in combination with the observation of the lead pattern and the print at an angle differing from $\pi/2$. If the condition of equidistance is not fulfilled, this will lead to parallax; object and image observed at the same angle no longer coincide after being united (see course of process).

The choice between said first embodiment and said second embodiment is also made on the basis of the surface structure of the pad carrying members. If they are not flat, for example, with warped printed circuit boards (in combination with high-pitch), it may happen that the printed circuit board is not located in the theoretical plane of the contact area of the printed board holder, as a result of which the leads do not correspond to the footprint (print) of the component. In that event the first embodiment is strongly favoured. The second embodiment presents favourable possibilities for high-pitch components on flat substrates.

Side-effects such as the human eye serving as a detector also play an important role in this invention. In the first embodiment the object/image plane is perpendicular to the axis of observation. A binocular microscope can be applied and is probably desired for the observation of high-pitch components. In the second embodiment the object/image plane is at an angle of approximately $\pi/3$ to the axis of observation. The focusing ability of the human eye enables the observer to observe sharply every detail within the whole field of view. People having normal and presbyopic eyesight observe magnified versions of the details through a low-magnification magnifier.

The resolution of the human eye, for that matter, is dependent on the spacial frequency and the contrast between the objects to be observed. Ambient lighting will always cause more light to fall on the pad carrying member than on the under side of the component. A dedicated additional lighting system provides the necessary contrast between the pads, on the one hand, and the footprint of the leads, on the other.

The invention will be further explained with reference to the drawings 1 and 2 in which the two embodiments for the optical system will be shown in a diagrammatic and simplified manner in connection with the positioning and locating arrangement.

DETAILED DESCRIPTION OF THE PREFERRED EMBODIMENT

Figure 1:
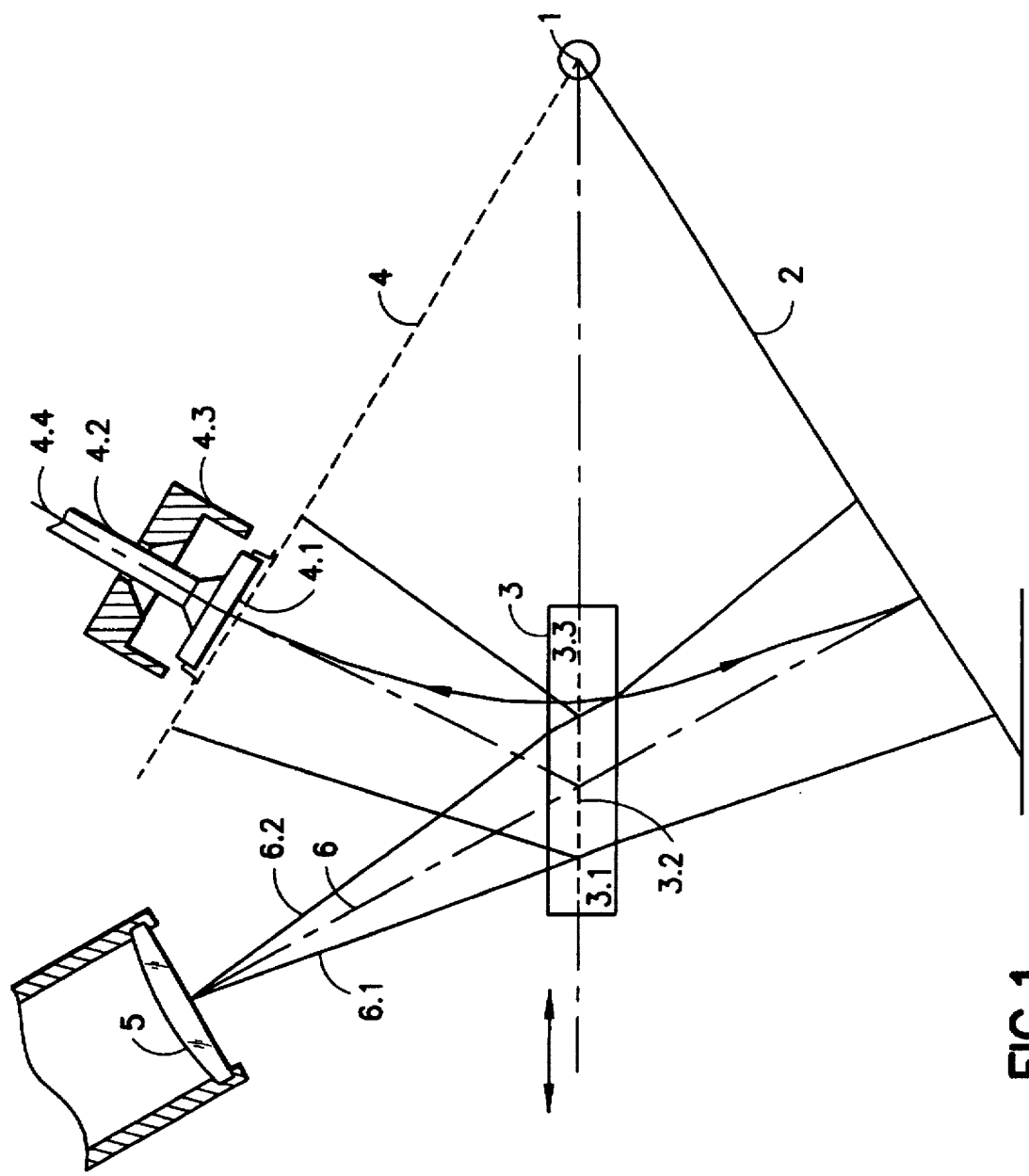
FIG. 1 is a diagrammatic representation in partial cross-section of an optical system according to a first embodiment of the invention.

FIG. 1 gives a diagrammatic representation of a cross-section of a system according to a first solution. The displacement of the component towards the pad carrying member is effected by a rotation around axis 1. The pad side of the pad carrying member is fixed in plane 2, the imaginary plane of the footprint of component 4.1 lies in plane 4, the semi-transparent mirror lies in plane 3.2; the three planes 2, 3.2 and 4 meet in axis 1 while the angles between the planes are mutually equal. The beam splitter assembly 3 comprises the semitransparent mirror 3.2, the mirror substrate 3.1 and the compensation plate 3.3. Observation takes place through magnifier 5, arranged in such a way that the optical axis 6 of the lens means is perpendicular to the centre of the field of view i.e. in the centre line 4.4 of the component fixing means. The component 4.1, the component fixing means 4.2 and, if required, the heating means 4.3, are shown in a diagrammatic way. Depending on ergonomics and desired field of view, the object plane and image plane will form an angle of approximately 30 degrees relative to the beam splitter. By displacing the printed circuit board in the directions of X and Y and rotating the component fixing means, the images of the pads and the connecting leads are arranged to be superimposed.

The beam splitter assembly is then reproducibly removed from the path of the component. The component fixing means holding the component is turned onto the printed circuit board in a rotating manner.

Figure 2:
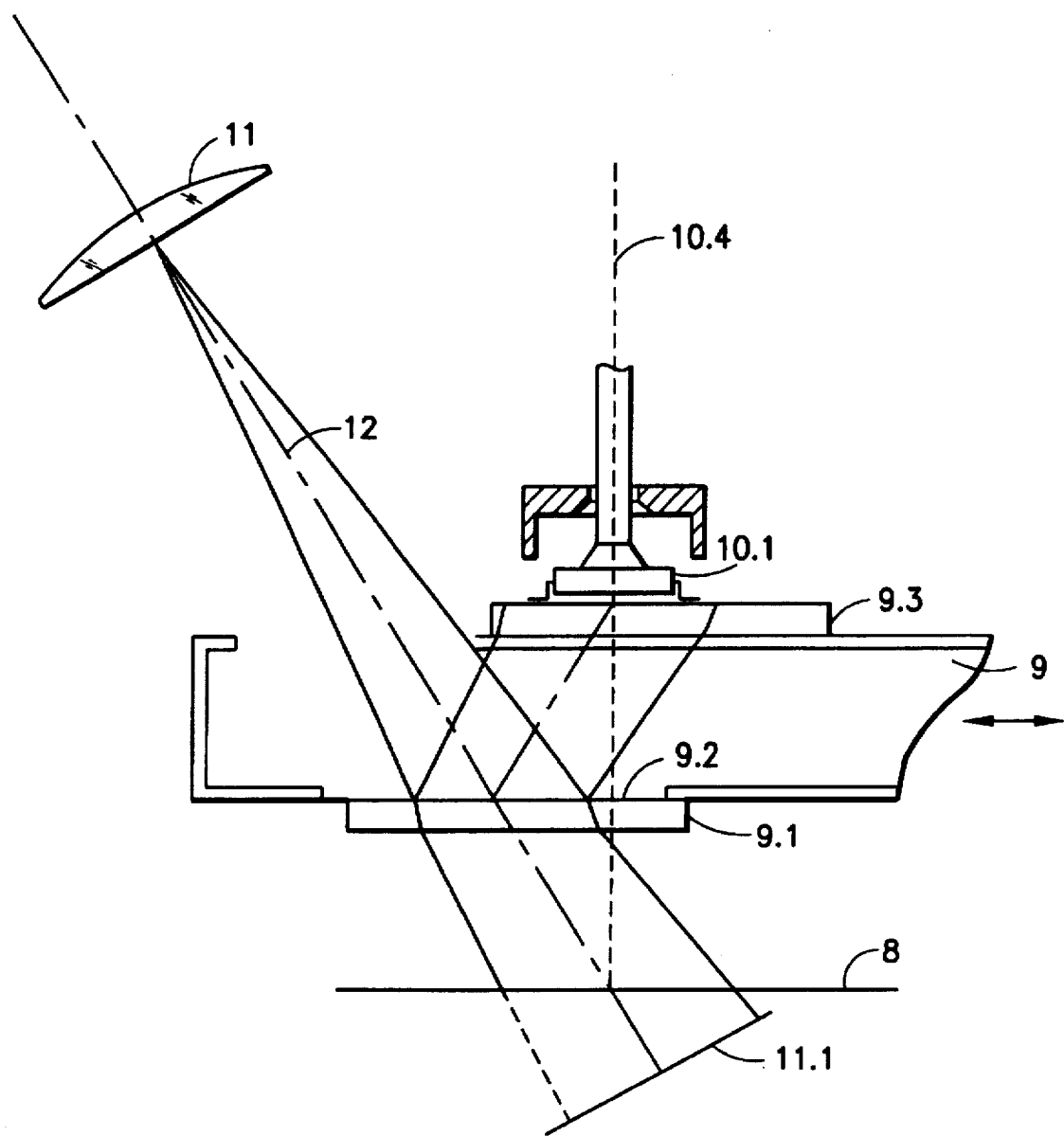
FIG. 2 is a diagrammatic representation in partial cross-section of an optical system according to a second embodiment of the invention.

FIG. 2 represents a system according to a second solution in which the reference plane 8 is the contact plane of the pad carrying member. Perpendicular thereto is the axis of displacement 10.4 of the component. The beam splitter assembly 9 comprises the semitransparent mirror 9.2, the mirror substrate 9.1 and the compensation plate 9.3 the upper surface of which compensation plate made of quartz functioning as a contact plane for the footprint of the connecting leads of the component 10.1. Mirror substrate and compensation plate should be adjusted to be perfectly in parallel. The angle of the beam splitter assembly should be adjustable, so that the beam splitter can be adjusted in parallel with the contact plane of the pad carrying member. The beam splitter assembly is height-adjustable so as to satisfy the condition of equidistance of the contact side of the printed board holder to the semitransparent mirror, on the one hand, and to the upper surface of the compensation plate, on the other. With the selected configuration there is achieved that, once the connecting leads have been aligned to the corresponding pads—once the splitter assembly has been removed in a reproducible manner—and the leads have been displaced vertically, these leads will coincide with the corresponding pads. The magnifier 11 with optical axis 6 is adjusted, so that the plane of focus 11.1 lies within the field of view behind the printed circuit side of the pad carrying member.

I claim:

1. System for simultaneously observing without parallax a pad carrying member and the corresponding connecting leads of a surface-mounted-device component for the mounting thereof, comprising a beam splitter (3) having a semitransparent mirror (3.2) and two parallel optically identical transparent flat substrates (3.1 and 3.3), each of said transparent flat substrates having first and second opposed and parallel sides, said semitransparent mirror being arranged between and in direct contact with said first sides of said transparent flat substrates, said second sides of said transparent flat substrates being parallel to each other and not in contact with said semitransparent mirror.

2. System as claimed in claim 1, further comprising:
means for reproducibly displacing said optical means and thereby permitting the component to be positioned on the pad carrying member.

3. System as claimed in claim 2, further comprising:
a lens means comprising one of a magnifier and a binocular microscope.

4. System as claimed in claim 2, further comprising:
a lens means comprising at least one high-resolution camera.

5. System as claimed in claim 1, further comprising:
a lens means comprising at least one high-resolution camera.

6. System as claimed in claim 1, further comprising:
a lens means comprising one of a magnifier and a binocular microscope.

7. System for mutually positioning a pad carrying member and the corresponding connecting leads of a multileaded component having a footprint, comprising:

a) means for fixing the pad carrying member in a prescribed plane (2);

b) means (4.2) for fixing the multileaded component (4.1) with the corresponding connecting leads of the multileaded component located along an imaginary plane (4), wherein said prescribed plane (2) and said imaginary plane (4) define an angle;

c) means for rotating the multileaded component relative to the pad carrying member;

d) optical means (3) including a semitransparent mirror (3.2) and two parallel optically identical transparent flat substrates (3.1 and 3.3), each of said transparent flat substrates having first and second opposed and parallel sides, said semitransparent mirror being arranged between and in direct contact with said first sides of said transparent flat substates, said second sides of said transparent flat substrates being parallel to each other and not in contact with said semitransparent mirror and said semitransparent mirror located along a third plane which bisects said angle, wherein said prescribed plane (2), said imaginary plane (4), and said third plane defining an axis (1) about which said means for rotating rotates the multileaded component relative to the pad carrying member; and e) lens means (5) directed via the optical means (3) at an angle of $\pi/2$ relative to the prescribed plane (2) for simultaneously observing both the footprint of the multileaded component and a corresponding section of the pad carrying member.

8. System as claimed in claim 7, further comprising:
means for reproducibly displacing said optical means and thereby permitting the component to be positioned on the pad carrying member.

9. System as claimed in claim 8, wherein:
said lens means comprises one of a magnifier and a binocular microscope.

10. System as claimed in claim 8, further comprising:
a lens means comprising at least one high-resolution camera.

11. System as claimed in claim 7, wherein:
said lens means comprises one of a magnifier and a binocular microscope.

12. System as claimed in claim 7, further comprising:
a lens means comprising at least one high-resolution camera.

13. System for mutually positioning a pad carrying member and a footprint of a component having multiple leads, comprising;

a) means for fixing the pad carrying member in a prescribed plane (8);

b) optical means (9) including a flat transparent supporting plate (9.3) which is parallel to the prescribed plane, a flat transparent substrate (9.1) which is parallel to the prescribed plane and optically identical to said flat transparent support plate, and a semitransparent mirror coating (9.2) located on said flat transparent substrate (9.1) and between said flat transparent substrate (9.1) and said flat transparent supporting plate (9.3) such that a first distance from the prescribed plane to said semitransparent mirror coating is essentially equal to a second distance from said semitransparent mirror coating to an upper surface of said supporting plate, said upper surface supporting the leads of the component (10.1);

c) means for moving the pad carrying member and the component relative to each other, and d) lens means (11) directed at said semitransparent mirror coating (9.2) of the optical means (9) at an angle smaller than $\pi/2$ for simultaneous observation of both the footprint of the component and a corresponding section of the pad carrying member.

14. System as claimed in claim 13, wherein:

said transparent supporting plate is made of quartz.

15. System as claimed in claim 13, wherein:

said means for moving comprise means for translating the pad carrying member in two orthogonal directions and component fixing means for fixing and rotating the component.

16. System as claimed in claim 15, further comprising:

a lens means comprising at least one high-resolution camera.

17. System as claimed in claim 13, further comprising:

means for reproducibly displacing said optical means and thereby permitting the component to be positioned on the pad carrying member.

18. System as claimed in claim 17, wherein:

said lens means comprises one of a magnifier and a binocular microscope.

19. System as claimed in claim 17, further comprising:

a lens means comprising at least one high-resolution camera.

20. System as claimed in claim 13, wherein:

said lens means comprises one of a magnifier and a binocular microscope.

* * * * *